(12) United States Patent
Dean et al.

(10) Patent No.: US 9,313,874 B2
(45) Date of Patent: Apr. 12, 2016

(54) ELECTRONIC SYSTEM WITH HEAT EXTRACTION AND METHOD OF MANUFACTURE THEREOF

(71) Applicant: SMART Storage Systems, Inc., Chandler, AZ (US)

(72) Inventors: David Lee Dean, Litchfield Park, AZ (US); Robert W. Ellis, Phoenix, AZ (US)

(73) Assignee: SMART STORAGE SYSTEMS, INC., Chandler, AZ (US)

( * ) Notice: Subject to any disclaimer, the term of this patent is extended or adjusted under 35 U.S.C. 154(b) by 214 days.

(21) Appl. No.: 13/922,105

(22) Filed: Jun. 19, 2013

(65) Prior Publication Data

US 2014/0376190 A1 Dec. 25, 2014

(51) Int. Cl.
| | |
|---|---|
| *H05K 7/20* | (2006.01) |
| *H05K 1/02* | (2006.01) |
| *H05K 3/30* | (2006.01) |
| *H01L 23/367* | (2006.01) |
| *H01L 21/48* | (2006.01) |
| *H01L 23/473* | (2006.01) |

(52) U.S. Cl.
CPC .......... *H05K 1/0204* (2013.01); *H01L 21/4871* (2013.01); *H01L 21/4882* (2013.01); *H01L 23/367* (2013.01); *H05K 3/303* (2013.01); *H01L 2924/0002* (2013.01); *Y10T 29/4913* (2015.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | |
|---|---|---|---|
| 4,048,481 | A | 9/1977 | Bailey, Jr. et al. |
| 4,839,587 | A | 6/1989 | Flatley et al. |
| 5,210,680 | A | 5/1993 | Scheibler |
| 5,311,395 | A | 5/1994 | McGaha et al. |
| 5,479,638 | A | 12/1995 | Assar et al. |
| 5,489,805 | A | 2/1996 | Hackitt et al. |
| 5,628,031 | A | 5/1997 | Kikinis et al. |

(Continued)

FOREIGN PATENT DOCUMENTS

| | | |
|---|---|---|
| CN | 201 655 782 | 11/2010 |
| CN | 102 446 873 | 5/2012 |

(Continued)

OTHER PUBLICATIONS

Cooke, "Introduction to Flash Memory (T1A)," Flash Memory Summit, Aug. 22, 2008, Micron Teckmoiogy, Inc., 102 pages.

(Continued)

*Primary Examiner* — Anthony Haughton
*Assistant Examiner* — Razmeen Gafur
(74) *Attorney, Agent, or Firm* — Morgan, Lewis & Bockius LLP

(57) ABSTRACT

An electronic system, and a method of manufacture thereof, including: a substrate; an electrical device over the substrate; and a surface mount heat sink next to the electrical device, the surface mount heat sink having an extruded shape characteristic of being formed using an extrusion mechanism.

7 Claims, 8 Drawing Sheets

(56) References Cited

U.S. PATENT DOCUMENTS

| | | |
|---|---|---|
| 5,705,850 A | 1/1998 | Ashiwake et al. |
| 5,763,950 A | 6/1998 | Fujisaki et al. |
| 5,828,549 A | 10/1998 | Gandre et al. |
| 5,923,532 A | 7/1999 | Nedved |
| 5,930,504 A | 7/1999 | Gabel |
| 5,946,190 A * | 8/1999 | Patel .................. F28F 3/02 165/104.21 |
| 5,949,785 A | 9/1999 | Beasley |
| 5,963,983 A | 10/1999 | Sakakura et al. |
| 6,008,987 A | 12/1999 | Gale et al. |
| 6,009,938 A * | 1/2000 | Smith ................ H01L 21/4882 165/185 |
| 6,031,730 A | 2/2000 | Kroske |
| 6,061,245 A | 5/2000 | Ingraham et al. |
| 6,084,773 A * | 7/2000 | Nelson .................. H05K 5/026 361/704 |
| 6,091,652 A | 7/2000 | Haehn et al. |
| 6,275,436 B1 | 8/2001 | Tobita et al. |
| 6,335,862 B1 | 1/2002 | Koya |
| 6,345,367 B1 | 2/2002 | Sinclair |
| 6,356,447 B2 | 3/2002 | Scafidi |
| 6,381,670 B1 | 4/2002 | Lee et al. |
| 6,411,511 B1 | 6/2002 | Chen |
| 6,412,080 B1 | 6/2002 | Fleming et al. |
| 6,507,101 B1 | 1/2003 | Morris |
| 6,529,997 B1 | 3/2003 | Debiez et al. |
| 6,541,310 B1 | 4/2003 | Lo et al. |
| 6,552,581 B1 | 4/2003 | Gabara |
| 6,570,762 B2 | 5/2003 | Cross et al. |
| 6,587,915 B1 | 7/2003 | Kim |
| 6,618,249 B2 | 9/2003 | Fairchild |
| 6,621,705 B1 | 9/2003 | Ballenger et al. |
| 6,728,913 B1 | 4/2004 | Parker |
| 6,762,942 B1 | 7/2004 | Smith |
| 6,763,424 B2 | 7/2004 | Conley |
| 6,775,792 B2 | 8/2004 | Ulrich et al. |
| 6,778,387 B2 | 8/2004 | Fairchild |
| 6,850,443 B2 | 2/2005 | Lofgren et al. |
| 6,854,070 B2 | 2/2005 | Johnson et al. |
| 6,903,972 B2 | 6/2005 | Lasser et al. |
| 6,906,961 B2 | 6/2005 | Eggleston et al. |
| 6,934,152 B1 | 8/2005 | Barrow |
| 6,975,028 B1 | 12/2005 | Wayburn et al. |
| 6,997,720 B2 | 2/2006 | Perret et al. |
| 7,030,482 B2 * | 4/2006 | Haines .................. H01L 23/60 174/358 |
| 7,075,788 B2 | 7/2006 | Larson et al. |
| 7,079,972 B1 | 7/2006 | Wood et al. |
| 7,082,495 B2 | 7/2006 | DeWhitt et al. |
| 7,107,389 B2 | 9/2006 | Inagaki et al. |
| 7,139,864 B2 | 11/2006 | Bennett et al. |
| 7,233,497 B2 | 6/2007 | Simon et al. |
| 7,233,501 B1 | 6/2007 | Ingalz |
| 7,243,186 B2 | 7/2007 | Liang et al. |
| 7,280,364 B2 | 10/2007 | Harris et al. |
| 7,330,927 B1 | 2/2008 | Reeve et al. |
| 7,333,364 B2 | 2/2008 | Yu et al. |
| 7,350,101 B1 | 3/2008 | Nguyen et al. |
| 7,355,896 B2 | 4/2008 | Li et al. |
| 7,434,122 B2 | 10/2008 | Jo |
| 7,441,067 B2 | 10/2008 | Gorobets et al. |
| 7,474,528 B1 | 1/2009 | Olesiewicz |
| 7,480,147 B2 | 1/2009 | Hoss et al. |
| 7,516,267 B2 | 4/2009 | Coulson et al. |
| 7,595,994 B1 | 9/2009 | Sun |
| 7,599,182 B2 | 10/2009 | Sun |
| 7,613,871 B2 | 11/2009 | Tanaka et al. |
| 7,620,769 B2 | 11/2009 | Lee et al. |
| 7,623,343 B2 | 11/2009 | Chen |
| 7,639,532 B2 | 12/2009 | Roohparvar et al. |
| 7,661,054 B2 | 2/2010 | Huffman et al. |
| 7,679,948 B2 | 3/2010 | Park et al. |
| 7,738,502 B2 | 6/2010 | Chang et al. |
| 7,743,216 B2 | 6/2010 | Lubbers et al. |
| 7,818,525 B1 | 10/2010 | Frost et al. |
| 7,827,348 B2 | 11/2010 | Lee et al. |
| 7,830,164 B2 | 11/2010 | Earle et al. |
| 7,959,445 B1 | 6/2011 | Daily et al. |
| 7,961,462 B2 | 6/2011 | Hernon |
| 7,979,614 B1 | 7/2011 | Yang |
| 7,980,863 B1 | 7/2011 | Holec et al. |
| 7,989,709 B2 | 8/2011 | Tsao |
| 8,000,096 B2 | 8/2011 | Nemoz et al. |
| 8,001,135 B2 | 8/2011 | Perlmutter et al. |
| 8,010,738 B1 | 8/2011 | Chilton et al. |
| 8,028,123 B2 | 9/2011 | Kilzer et al. |
| 8,046,645 B2 | 10/2011 | Hsu et al. |
| 8,051,241 B2 | 11/2011 | Feldman et al. |
| 8,072,805 B2 | 12/2011 | Chou et al. |
| 8,095,724 B2 | 1/2012 | Ji et al. |
| 8,095,765 B2 | 1/2012 | Asnaashari et al. |
| 8,117,396 B1 | 2/2012 | Fair et al. |
| 8,127,202 B2 | 2/2012 | Cornwell et al. |
| 8,145,984 B2 | 3/2012 | Sommer et al. |
| 8,154,921 B2 | 4/2012 | Mokhlesi et al. |
| 8,169,825 B1 | 5/2012 | Shalvi et al. |
| 8,208,252 B2 | 6/2012 | Tolliver |
| 8,219,724 B1 | 7/2012 | Caruso et al. |
| 8,219,776 B2 | 7/2012 | Forhan et al. |
| 8,228,701 B2 | 7/2012 | Sokolov et al. |
| 8,245,101 B2 | 8/2012 | Olbrich et al. |
| 8,254,172 B1 | 8/2012 | Kan |
| 8,259,506 B1 | 9/2012 | Sommer et al. |
| 8,289,801 B2 | 10/2012 | Smith et al. |
| 8,305,103 B2 | 11/2012 | Kang et al. |
| 8,332,578 B2 | 12/2012 | Frickey, III et al. |
| 8,363,413 B2 | 1/2013 | Paquette et al. |
| 8,369,141 B2 | 2/2013 | Sommer et al. |
| 8,373,986 B2 | 2/2013 | Sun |
| 8,386,700 B2 | 2/2013 | Olbrich et al. |
| 8,405,985 B1 | 3/2013 | Reynov et al. |
| 8,407,409 B2 | 3/2013 | Kawaguchi |
| 8,464,106 B2 | 6/2013 | Filor et al. |
| 8,472,183 B1 | 6/2013 | Ross et al. |
| 8,477,495 B2 | 7/2013 | Sun |
| 8,570,740 B2 | 10/2013 | Cong et al. |
| 8,599,560 B2 | 12/2013 | Wu et al. |
| 8,612,804 B1 | 12/2013 | Kang et al. |
| 9,089,073 B2 | 7/2015 | Reynov et al. |
| 2002/0008963 A1 | 1/2002 | DiBene, II et al. |
| 2002/0076951 A1 | 6/2002 | Roy |
| 2002/0123259 A1 | 9/2002 | Yatskov et al. |
| 2002/0159285 A1 | 10/2002 | Morley et al. |
| 2003/0046603 A1 | 3/2003 | Harari et al. |
| 2003/0074592 A1 | 4/2003 | Hasegawa |
| 2003/0163633 A1 | 8/2003 | Aasheim et al. |
| 2003/0184970 A1 | 10/2003 | Bosch et al. |
| 2004/0080985 A1 | 4/2004 | Chang et al. |
| 2004/0218367 A1 | 11/2004 | Lin et al. |
| 2004/0252670 A1 | 12/2004 | Rong et al. |
| 2005/0009382 A1 | 1/2005 | Burmeister et al. |
| 2005/0013120 A1 * | 1/2005 | Liu .................. H01L 23/3675 361/707 |
| 2005/0021904 A1 | 1/2005 | Iaculo et al. |
| 2005/0038792 A1 | 2/2005 | Johnson |
| 2005/0073884 A1 | 4/2005 | Gonzalez et al. |
| 2005/0082663 A1 | 4/2005 | Wakiyama et al. |
| 2005/0152112 A1 | 7/2005 | Holmes et al. |
| 2006/0020745 A1 | 1/2006 | Conley et al. |
| 2006/0042291 A1 | 3/2006 | Petroski |
| 2006/0067066 A1 | 3/2006 | Meier et al. |
| 2006/0133041 A1 | 6/2006 | Belady et al. |
| 2006/0136682 A1 | 6/2006 | Haridas et al. |
| 2006/0143365 A1 | 6/2006 | Kikuchi |
| 2006/0253641 A1 | 11/2006 | Gatzemeier et al. |
| 2006/0256624 A1 | 11/2006 | Eggleston et al. |
| 2006/0282644 A1 | 12/2006 | Wong |
| 2006/0294574 A1 | 12/2006 | Cha |
| 2007/0001282 A1 | 1/2007 | Kang et al. |
| 2007/0057686 A1 | 3/2007 | Suga et al. |
| 2007/0061511 A1 | 3/2007 | Faber |
| 2007/0074850 A1 * | 4/2007 | Peschl .................. F28F 3/02 165/80.3 |
| 2007/0083779 A1 | 4/2007 | Misaka et al. |

(56) References Cited

U.S. PATENT DOCUMENTS

| | | | |
|---|---|---|---|
| 2007/0121297 A1* | 5/2007 | Uchizono | H05K 7/20963 361/704 |
| 2007/0211426 A1* | 9/2007 | Clayton | H01L 23/473 361/689 |
| 2007/0211436 A1* | 9/2007 | Robinson | H01L 23/552 361/719 |
| 2007/0216005 A1 | 9/2007 | Yim et al. | |
| 2007/0216009 A1 | 9/2007 | Ng | |
| 2007/0230111 A1 | 10/2007 | Starr et al. | |
| 2007/0234004 A1 | 10/2007 | Oshima et al. | |
| 2007/0246189 A1* | 10/2007 | Lin | H01L 23/367 165/80.3 |
| 2007/0247805 A1 | 10/2007 | Fujie et al. | |
| 2007/0260811 A1 | 11/2007 | Merry, Jr. et al. | |
| 2007/0263444 A1 | 11/2007 | Gorobets et al. | |
| 2007/0276973 A1 | 11/2007 | Tan et al. | |
| 2008/0019095 A1* | 1/2008 | Liu | H01L 23/367 361/704 |
| 2008/0026637 A1 | 1/2008 | Minich | |
| 2008/0043435 A1 | 2/2008 | Yip et al. | |
| 2008/0046630 A1 | 2/2008 | Lasser | |
| 2008/0052435 A1 | 2/2008 | Norwood et al. | |
| 2008/0052446 A1 | 2/2008 | Lasser et al. | |
| 2008/0068796 A1 | 3/2008 | Pay et al. | |
| 2008/0082736 A1 | 4/2008 | Chow et al. | |
| 2008/0158818 A1 | 7/2008 | Clidaras et al. | |
| 2008/0183918 A1 | 7/2008 | Dhokia et al. | |
| 2008/0236791 A1 | 10/2008 | Wayman | |
| 2008/0252324 A1 | 10/2008 | Barabi et al. | |
| 2008/0254573 A1 | 10/2008 | Sir et al. | |
| 2008/0266807 A1* | 10/2008 | Lakin | H05K 7/20409 361/709 |
| 2008/0291636 A1* | 11/2008 | Mori | H01L 23/3735 361/709 |
| 2008/0313505 A1 | 12/2008 | Lee et al. | |
| 2009/0019321 A1 | 1/2009 | Radke | |
| 2009/0083587 A1 | 3/2009 | Ng et al. | |
| 2009/0089485 A1 | 4/2009 | Yeh | |
| 2009/0138654 A1 | 5/2009 | Sutardja | |
| 2009/0146721 A1 | 6/2009 | Kurooka et al. | |
| 2009/0157948 A1 | 6/2009 | Trichina et al. | |
| 2009/0164702 A1 | 6/2009 | Kern | |
| 2009/0172262 A1 | 7/2009 | Olbrich et al. | |
| 2009/0190308 A1 | 7/2009 | Bhattacharya et al. | |
| 2009/0228761 A1 | 9/2009 | Perlmutter et al. | |
| 2009/0259819 A1 | 10/2009 | Chen et al. | |
| 2009/0259896 A1 | 10/2009 | Hsu et al. | |
| 2009/0273898 A1 | 11/2009 | Imsand | |
| 2009/0302458 A1* | 12/2009 | Kubo | H01L 23/3672 257/706 |
| 2009/0309214 A1 | 12/2009 | Szewerenko et al. | |
| 2009/0323419 A1 | 12/2009 | Lee et al. | |
| 2009/0327581 A1 | 12/2009 | Coulson | |
| 2009/0327591 A1 | 12/2009 | Moshayedi | |
| 2010/0008034 A1 | 1/2010 | Hinkle | |
| 2010/0017650 A1 | 1/2010 | Chin et al. | |
| 2010/0023674 A1 | 1/2010 | Aviles | |
| 2010/0050053 A1 | 2/2010 | Wilson et al. | |
| 2010/0073860 A1 | 3/2010 | Moriai et al. | |
| 2010/0073880 A1* | 3/2010 | Liu | H01L 23/427 361/700 |
| 2010/0091463 A1* | 4/2010 | Buresch | H01L 23/367 361/718 |
| 2010/0118496 A1* | 5/2010 | Lo | F21V 15/013 361/710 |
| 2010/0138592 A1 | 6/2010 | Cheon | |
| 2010/0169541 A1 | 7/2010 | Freikorn | |
| 2010/0174845 A1 | 7/2010 | Gorobets et al. | |
| 2010/0217898 A1 | 8/2010 | Priborsky et al. | |
| 2010/0217915 A1 | 8/2010 | O'Connor et al. | |
| 2010/0224985 A1 | 9/2010 | Michael et al. | |
| 2010/0228928 A1 | 9/2010 | Asnaashari et al. | |
| 2010/0262792 A1 | 10/2010 | Hetzler et al. | |
| 2010/0262795 A1 | 10/2010 | Hetzler et al. | |
| 2010/0262875 A1 | 10/2010 | Hetzler et al. | |
| 2010/0287328 A1 | 11/2010 | Feldman et al. | |
| 2010/0293367 A1 | 11/2010 | Berke et al. | |
| 2010/0296255 A1* | 11/2010 | Maloney | H01L 23/4093 361/720 |
| 2010/0312954 A1 | 12/2010 | Jeon et al. | |
| 2010/0318719 A1 | 12/2010 | Keays et al. | |
| 2010/0319986 A1 | 12/2010 | Bleau et al. | |
| 2010/0328887 A1* | 12/2010 | Refai-Ahmed | H01L 23/427 361/697 |
| 2010/0332726 A1 | 12/2010 | Wang | |
| 2011/0055468 A1 | 3/2011 | Gonzalez et al. | |
| 2011/0066788 A1 | 3/2011 | Eleftheriou et al. | |
| 2011/0131365 A1 | 6/2011 | Zhang et al. | |
| 2011/0131447 A1 | 6/2011 | Prakash et al. | |
| 2011/0132000 A1 | 6/2011 | Deane et al. | |
| 2011/0145473 A1 | 6/2011 | Maheshwari | |
| 2011/0182035 A1* | 7/2011 | Yajima | H01L 23/40 361/717 |
| 2011/0188205 A1* | 8/2011 | MacManus | H05K 7/20 361/703 |
| 2011/0190963 A1 | 8/2011 | Glassl et al. | |
| 2011/0191522 A1 | 8/2011 | Condict et al. | |
| 2011/0191649 A1 | 8/2011 | Lim et al. | |
| 2011/0238892 A1 | 9/2011 | Tsai et al. | |
| 2011/0299244 A1* | 12/2011 | Dede | F28F 3/046 361/689 |
| 2011/0317359 A1 | 12/2011 | Wei et al. | |
| 2011/0320687 A1 | 12/2011 | Belluomini et al. | |
| 2012/0014067 A1* | 1/2012 | Siracki | H01L 21/4882 361/709 |
| 2012/0047320 A1 | 2/2012 | Yoo et al. | |
| 2012/0047409 A1 | 2/2012 | Post et al. | |
| 2012/0064781 A1 | 3/2012 | Krishnan et al. | |
| 2012/0124046 A1 | 5/2012 | Provenzano | |
| 2012/0124273 A1 | 5/2012 | Goss et al. | |
| 2012/0151260 A1 | 6/2012 | Zimmermann et al. | |
| 2012/0170224 A1 | 7/2012 | Fowler et al. | |
| 2012/0201007 A1* | 8/2012 | Yeh | H05K 1/0203 361/719 |
| 2012/0216085 A1 | 8/2012 | Weingarten et al. | |
| 2012/0239858 A1 | 9/2012 | Melik-Martirosian | |
| 2012/0266048 A1 | 10/2012 | Chung et al. | |
| 2012/0293962 A1* | 11/2012 | McCluskey | H01L 23/38 361/715 |
| 2012/0327598 A1 | 12/2012 | Nakayama | |
| 2012/0331207 A1 | 12/2012 | Lassa et al. | |
| 2013/0007380 A1 | 1/2013 | Seekins et al. | |
| 2013/0007543 A1 | 1/2013 | Goss et al. | |
| 2013/0073788 A1 | 3/2013 | Post et al. | |
| 2013/0080691 A1 | 3/2013 | Weingarten et al. | |
| 2013/0100600 A1 | 4/2013 | Yin et al. | |
| 2013/0124792 A1 | 5/2013 | Melik-Martirosian et al. | |
| 2013/0155800 A1 | 6/2013 | Shim et al. | |
| 2013/0285686 A1 | 10/2013 | Malik et al. | |
| 2013/0294028 A1 | 11/2013 | Lafont et al. | |
| 2013/0307060 A1 | 11/2013 | Wang et al. | |
| 2014/0055944 A1 | 2/2014 | McCabe et al. | |
| 2014/0108891 A1 | 4/2014 | Strasser et al. | |
| 2014/0153181 A1 | 6/2014 | Peng et al. | |
| 2014/0182814 A1 | 7/2014 | Lin | |

FOREIGN PATENT DOCUMENTS

| | | |
|---|---|---|
| DE | 199 10 500 A1 | 10/2000 |
| DE | 2005 063281 | 7/2007 |
| EP | 0 600 590 A1 | 6/1994 |
| EP | 0 989 794 A2 | 3/2000 |
| EP | 1 990 921 A2 | 11/2008 |
| EP | 2 066 158 A2 | 6/2009 |
| EP | 2 395 827 A2 | 12/2011 |
| EP | 2 600 700 A1 | 6/2013 |
| FR | 2560731 | 9/1985 |
| JP | 06006064 | 1/1994 |
| JP | 2003 188565 | 7/2003 |
| WO | WO 98 07193 | 3/1988 |
| WO | WO 03/094586 A1 | 11/2003 |
| WO | WO 2004/086827 A2 | 10/2004 |

(56) References Cited

FOREIGN PATENT DOCUMENTS

| WO | WO 2008/013850 A2 | 1/2008 |
| WO | WO 2009/042298 A1 | 4/2009 |
| WO | WO 2013/080341 | 6/2013 |

OTHER PUBLICATIONS

Gai et al., "Algorithms and Data Structures for Flash Memories," ACM Computing Surveys, Jun. 2005, vol. 37, No. 2, 30 pages.
IBM Corporation, "Systems Management, Work Management," Version 5, Release 4, 9th Edition, Feb. 2006, pp. 1-21.
O'Brien, "SMART Storage Systems Optimus SAS Enterprise SSD Review," SMART Storage Systems, Oct. 9, 2012, 44 pages.
Spanjer, "Flash Management—Why and How?" Smart Modular Technologies, Nov. 2009, http://www.scantec.de/fileadmin/pdf/Smart_Modular/Flash-Management.pdf, 14 pages.
Texas Instruments, "Power Management IC for Digital Set Top Boxes," SLVSA10A, Sep. 2009, pp. 1-22.
International Search Report and Written Opinion dated Dec. 20, 2013, received in PCT/US2013/045282, which corresponds to U.S. Appl. No. 13/493,949, 7 pages (Ellis).
International Search Report and Written Opinion dated Jun. 12, 2014, received in PCT/US2014/018972, which corresponds to U.S. Appl. No. 13/779,352, 12 pages (Schmier).
International Search Report and Written Opinion dated May 14, 2014, received in International Patent Application No. PCT/US2014/017168, which corresponds to U.S Appl. No. 14/076,115, 6 pages (Fitzpatrick).
International Search Report and Written Opinion dated May 14, 2014, received in International Patent Application No. PCT/US2014/017169, which corresponds to U.S. Appl. No. 14/076,148, 6 pages (Fitzpatrick).
International Search Report and Written Opinion dated Dec. 16, 2014, received in International Patent Application No. PCT/US2014/059114, which corresponds to U.S. Appl. No. 14/135,223, 9 pages (Dean).
International Search Report and Written Opinion dated Nov. 20, 2014, received in International Patent Application No. PCT/US2014/020290, which corresponds to U.S. Appl. No. 13/791,797, 21 pages (Dean).
International Search Report and Written Opinion dated Dec. 23, 2014, received in International Patent Application No. PCT/US2014/042772, which corresponds to U.S. Appl. No. 13/922,105, 10 pages (Dean).
International Search Report and Written Opinion dated Apr. 28, 2015, received in International Patent Application No. PCT/US2015/014563, which corresponds to U.S. Appl. No. 14/179,247, 9 pages (Ellis).
International Search Report and Written Opinion dated May 8, 2015, received in International Patent Application No. PCT/US2015/017722, which corresponds to U.S. Appl. No. 14/277,716, 9 pages (Dean).
International Search Report and Written Opinion dated May 13, 2015, received in International Patent Application No. PCT/US2015/017724, which corresponds to U.S. Appl. No. 14/244,734, 12 pages (Dean).
International Search Report and Written Opinion dated May 18, 2015, received in International Patent Application No. PCT/US2015/016656, which corresponds to U.S. Appl. No. 14/275,690, 14 pages (Wright).
International Search Report and Written Opinion dated May 28, 2015, received in International Patent Application No. PCT/US2015/017729, which corresponds to U.S. Appl. No. 14/244,745, 14 pages (Ellis).
Ulinktech, "ATA Command Table (in Alphabetic Order)," Feb. 6, 2011. https://web.archive.org/web/20110206060820/http://www.ulinktech.com/downloads/AT, 6 pages.
International Search Report dated Mar. 25, 2014, received in International Patent Application No. PCT/US2013/072400, which corresponds to U.S. Appl. No. 13/690,337, 3 pages (Ellis).
Invitation to Pay Additional Fees dated Jul. 25, 2014, received in International Patent Application No. PCT/US2014/021290, which corresponds to U.S. Appl. No. 13/791,797, 6 pages (Dean).
International Search Report and Written Opinion dated Jul. 31, 2014, received in International Patent Application No. PCT/US2014/031465, which corresponds to U.S. Appl. No. 13/851,928, 13 pages (Ellis).
International Search Report and Written Opinion dated Jul. 31, 2014, received in International Patent Application No. PCT/US2014/033876, which corresponds to U.S. Appl. No. 13/861,326, 6 pages (Fitzpatrick).
International Search Report and Written Opinion dated Sep. 12, 2014, received in International Patent Application No. PCT/US2014/043146.

* cited by examiner

ELECTRONIC SYSTEM WITH HEAT EXTRACTION AND METHOD OF MANUFACTURE THEREOF

TECHNICAL FIELD

The present invention relates generally to an electronic system and more particularly to a system for heat extraction.

BACKGROUND ART

Electronic systems include functions and components of consumer and industrial electronics, especially devices such as computers, televisions, cellular phones, mobile devices, and digital video cameras. The electronic systems can include solid state disk (SSD) drives that are used as data storage, often called storage or memory.

The solid state disk drives are becoming extremely dense as drive capacities increase. In addition to the increase in capacities, there have been large increases in performance. Increase in both the capacity and performance require more power. This power generates a large amount of heat. Because of board densities, location a board, devices on the board, and the devices' locations, the use of heat sinks as a means for extracting or removing heat is becoming more difficult.

Thus, a need still remains for electronic systems with better heat extraction. In view of the increasing demand for data management devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an electronic system, including: providing a substrate; mounting an electrical device over the substrate; and mounting a surface mount heat sink next to the electrical device, the surface mount heat sink having an extruded shape characteristic of being formed using an extrusion mechanism.

The present invention provides an electronic system, including: a substrate; an electrical device over the substrate; and a surface mount heat sink next to the electrical device, the surface mount heat sink having an extruded shape characteristic of being formed using an extrusion mechanism.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
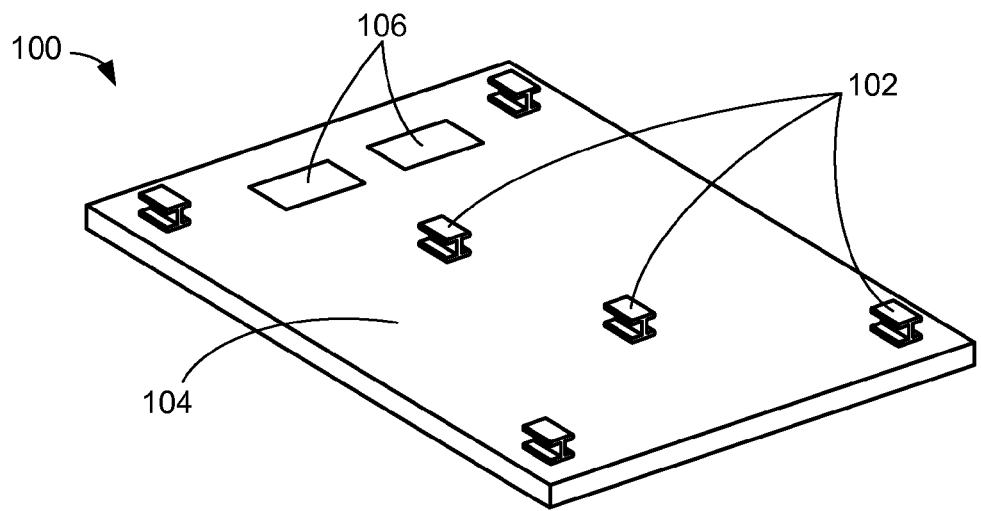
FIG. 1 is an electronic system with heat extraction in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

The term "thermal interface material" (TIM) referred to herein is defined as a layer that exists between thermally conductive materials. The thermal interface material can be a substrate interfacing to the thermally conductive materials. The term "via" referred to herein is defined as a through hole plated with a conductive material. The via in a printed circuit board (PCB) can connect different layers of the PCB together, both electrically and thermally.

The term "extruded" referred to herein is defined as formed or shaped by forcing through an opening. The term "extruded" is further defined as having uniform cross sections along their lengths.

With solid state disk (SSD) drives having larger capacity and higher performance, extracting the heat from these drives is increasingly difficult. Currently one of the most common ways to extract the heat is to design the case that covers only one side of the drive, leaving the other side to have components exposed. Additionally, computer systems using these drives are required to have a large airflow. This still leaves many "hot spots" in the drive. A way to get heat out of a device is to glue a heat sink to the device.

Traditionally, heat sinks are put on the board in a manual step. This is time consuming and costly. This invention is a process that will remove this hand assembly from the manufacturing of a system that uses PCB's (printed circuit boards).

One means for extracting the heat from the drive is to design a case that has an extremely small air gap from the components to the inside of the case. This creates some problems when the case flexes and is in contact with the individual components on the board. This method is also not very selective as to where the heat is extracted.

Additionally, it is difficult to attach the heat sinks to the devices on the board. Attaching the heat sinks to the devices also makes it difficult to re-work the component. Some components may not have surfaces that are able to take the glue that would be required to affix the heat sinks to the components or devices.

Referring now to FIG. 1, therein is shown an electronic system 100 with heat extraction in an embodiment of the present invention. The electronic system 100 can include surface mount heat sinks 102, which are defined as structures that conduct heat away from devices for cooling the devices.

The basic idea is to construct the surface mount heat sinks 102 as small conductive heat sink components that are in a surface mount form factor. The surface mount heat sinks 102 have predefined dimensions. The surface mount heat sinks 102 can be associated with footprints with the predefined dimensions for ease of designing a substrate 104, which is defined as a structure used to mechanically support and electrically connect electrical components. The footprints are geometrical information associated with components that are to be attached to a support structure.

The surface mount heat sinks 102 can be placed next to electrical devices 106. The electrical devices 106 can be mounted over the substrate 104. Heat generated from the electrical devices 106 can be conducted to the surface mount heat sinks 102.

For example, the substrate 104 can be a printed circuit board (PCB). Also for example, the surface mount heat sinks 102 can comply with predefined surface mount technology (SMT) footprints so as to not require additional layout work to be done to the substrate 104 in order to use the surface mount heat sinks 102. As a specific example, the surface mount heat sinks 102 can be associated with predefined footprints that are available in libraries or collection of physical information used for layout of the substrate 104. Thus, a special footprint for the surface mount heat sinks 102 is not required.

FIG. 1 depicts the surface mount heat sinks 102 distributed over the substrate 104. The surface mount heat sinks 102 including surface mount device heat sink (SMDHS) devices can be located in open areas of the substrate 104 where there are no other components mounted over the substrate 104. The distribution of the surface mount heat sinks 102 can form a plane, which can be connected with another layer of the electronic system 100 including another PCB or an external case.

Figure 2:
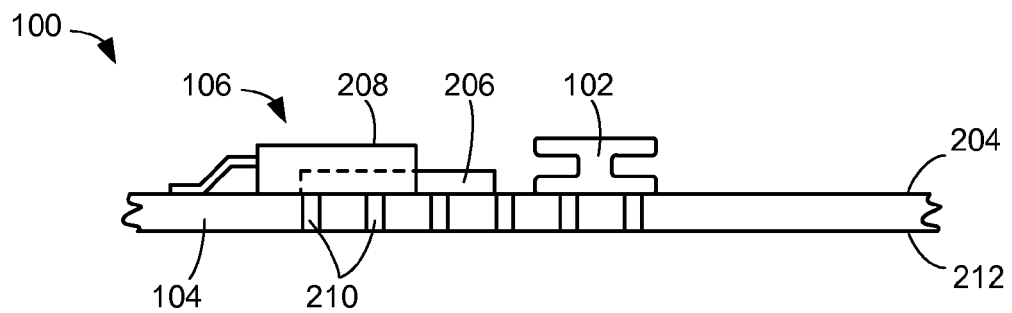
FIG. 2 is a cross-sectional view of the electronic system taken along line 2-2 of FIG. 3.
Figure 3:
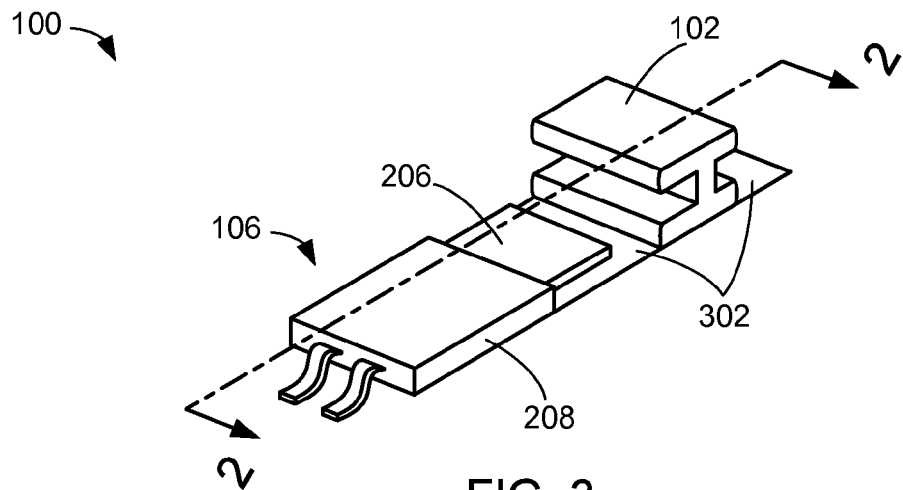
FIG. 3 is a top isometric view of a portion of the electronic system.

Referring now to FIG. 2, therein is shown a cross-sectional view of the electronic system 100 taken along line 2-2 of FIG. 3. The surface mount heat sinks 102 can be placed next to the electrical devices 106. FIG. 2 depicts a basic heat sink mounting and placement of the surface mount heat sinks 102. The electrical devices 106 can be hot devices or devices that are actively dissipating heat. The electrical devices 106 can be mounted over the substrate 104.

This invention is ideal for extracting heat from localized components or the electrical devices 106 that are next to the surface mount heat sinks 102 in a PCB assembly. The surface mount heat sinks 102 have an ability to transfer heat from the electrical devices 106 to another PCB in the electronic system 100 or directly to a case of the electronic system 100, which will be subsequently described in more details. One of the surface mount heat sinks 102 can share a thermally conductive and electrically conductive pad (not shown) on a substrate top side 204 of the substrate 104 for attaching to active components or the electrical devices 106.

FIG. 2 depicts an application of one of the surface mount heat sinks 102 placed over the substrate 104. One of the surface mount heat sinks 102 can be placed next to a device heat sink tab 206 of one of the electrical devices 106 including an SMD. The device heat sink tab 206 is a pin of one of the electrical devices 106 used for heat extraction purposes. The device heat sink tab 206 can be a heat conductive mount tab. The one of the surface mount heat sinks 102 can be thermally and electrically connected to the device heat sink tab 206. The one of the surface mount heat sinks 102 is not directly over or attached to a top side of a package body 208 of one of the electrical devices 106.

The device heat sink tab 206 and the surface mount heat sinks 102 can be placed directly over vias 210. The vias 210 can be optionally connected to a ground plane at a substrate bottom side 212 of the substrate 104. The surface mount heat sinks 102 can be thermally and electrically connected to the ground plane through the vias 210. The vias 210 can be in between the surface mount heat sinks 102 and the ground plane.

A dashed line in FIG. 2 shows that one of the electrical devices 106 has an electrical and heat attach point or the device heat sink tab 206, which extends from the outside of the one of the electrical devices 106 to the inside of the one of the electrical devices 106. Typically, the package body 208 can include an encapsulation material including plastic, and a slug or the device heat sink tab 206 can include a conductive material including a solder-able metal. The dashed line is included as an attempt to show an external connection including solder, which is under the package body 208.

It has been discovered that the surface mount heat sinks 102 placed next to the electrical devices 106 provide improved reliability because there is no mechanical stress exerted on the electrical devices 106 since the surface mount heat sinks 102 are not placed directly over and attached to top sides of the electrical devices 106.

Referring now to FIG. 3, therein is shown a top isometric view of a portion of the electronic system 100. One of the surface mount heat sinks 102 is shown next to the package body 208 of one of the electrical devices 106 to allow heat extraction from the one of the electrical devices 106 to the one of the surface mount heat sinks 102.

The one of the surface mount heat sinks 102 and the device heat sink tab 206 can be mounted directly over and attached to a thermal pad 302 of the substrate 104 of FIG. 1. The surface mount heat sinks 102 can be associated with footprints that are used to design the thermal pad 302. For example, the one of the surface mount heat sinks 102 can be a surface mount device heat sink (SMDHS).

The thermal pad 302 is defined as a conductive structure for attaching a component thereto for extracting heat away from the component. The thermal pad 302 can be attached to both the one of the surface mount heat sinks 102 and the device heat sink tab 206. The thermal pad 302 can be the thermally conductive and electrically conductive structure previously described.

Figure 4:
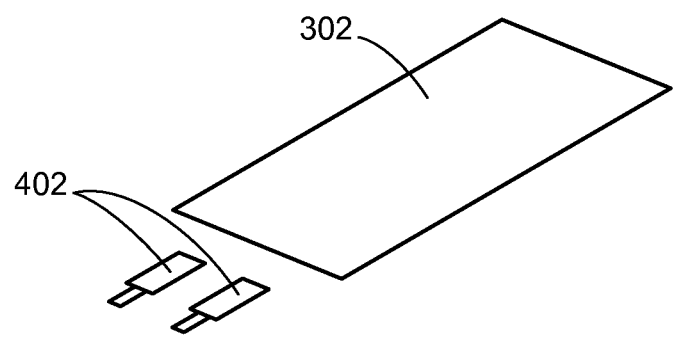
FIG. 4 is a top isometric view of the thermal pad of the substrate of FIG. 1.

Referring now to FIG. 4, therein is shown a top isometric view of the thermal pad 302 of the substrate 104 of FIG. 1. The substrate 104 includes device pads 402 adjacent the thermal pad 302 for mounting and attaching other pins of the electrical devices 106 of FIG. 1 different from the device heat sink tab 206 of FIG. 2.

The device heat sink tab 206 and the surface mount heat sinks 102 of FIG. 1 can be attached using a conductive material including solder to the thermal pad 302. Since the device heat sink tab 206 and the surface mount heat sinks 102 are both attached to the same foot print pad or the thermal pad 302, there is an extremely efficient thermal transfer between the active component and the surface mount heat sinks 102.

For example, the thermal pad 302 can include a conductive material including copper (Cu). The thermal pad 302 can be designed based on a footprint associated with the device heat sink tab 206 and the surface mount heat sinks 102.

Figure 5:
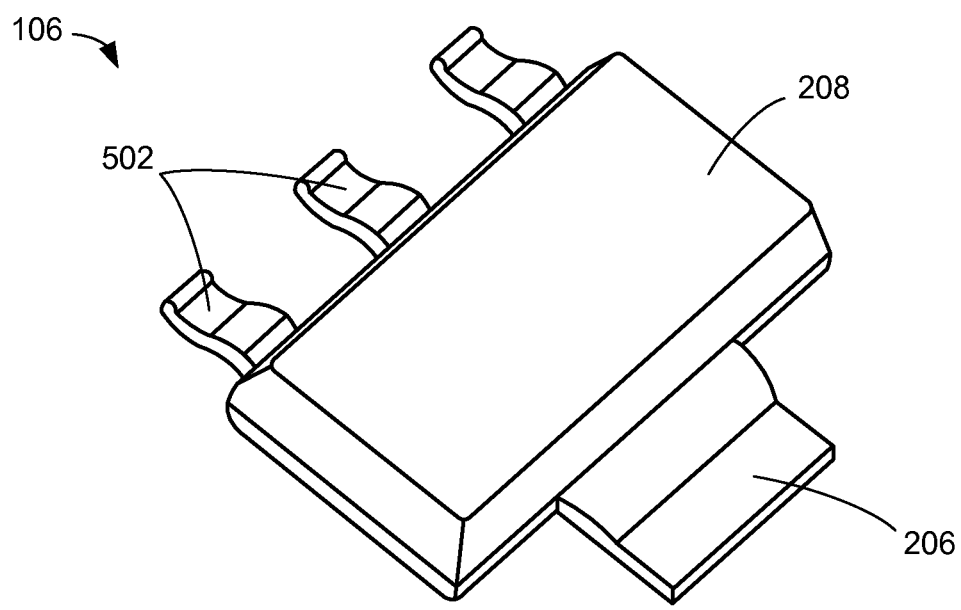
FIG. 5 is a top isometric view of one of the electrical devices.

Referring now to FIG. 5, therein is shown a top isometric view of one of the electrical devices 106. Each of the electrical devices 106 can include the package body 208, device pins 502, and the device heat sink tab 206. The device pins 502 can be attached to the device pads 402 of FIG. 4 of the substrate 104 of FIG. 1. The device heat sink tab 206 can be attached to the thermal pad 302 of FIG. 3 of the substrate 104 when the electrical devices 106 are installed or mounted over the substrate 104.

For illustrative purposes, one of the electrical devices 106 is shown with a 4-terminal small outline transistor package including SOT-223, although it is understood that the electrical devices 106 can include any package configurations. For example, the electrical devices 106 can include any package types, shapes, pin counts, dimensions, or any combination thereof.

Figure 6:
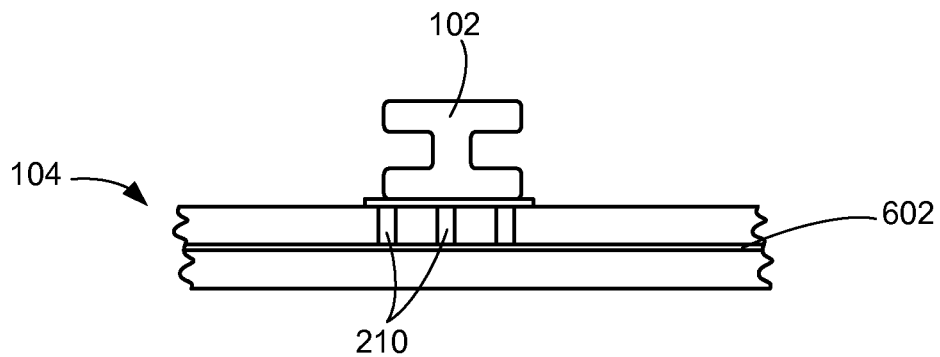
FIG. 6 is a cross-sectional view of the surface mount heat sinks connected to an internal reference layer.

Referring now to FIG. 6, therein is shown a cross-sectional view of the surface mount heat sinks 102 connected to an internal reference layer 602. The internal reference layer 602 is defined as a conductive structure for providing a reference potential level. The substrate 104 can be designed with the internal reference layer 602. The internal reference layer 602 is a conductive structure within the substrate 104.

For example, the internal reference layer 602 can be a power or ground plane layer. Also for example, the internal reference layer 602 can be an inner board ground or power plane. Further, for example, the internal reference layer 602 can be formed with an electrically conductive material including copper.

The surface mount heat sinks 102 can be directly on and electrically and thermally connected to the vias 210, which are directly connected to the internal reference layer 602. The surface mount heat sinks 102 can be electrically and thermally connected to the internal reference layer 602 through the vias 210. This allows the surface mount heat sinks 102 to extract heat from this thermally conductive layer or the internal reference layer 602 in the middle of the substrate 104.

Figure 7:
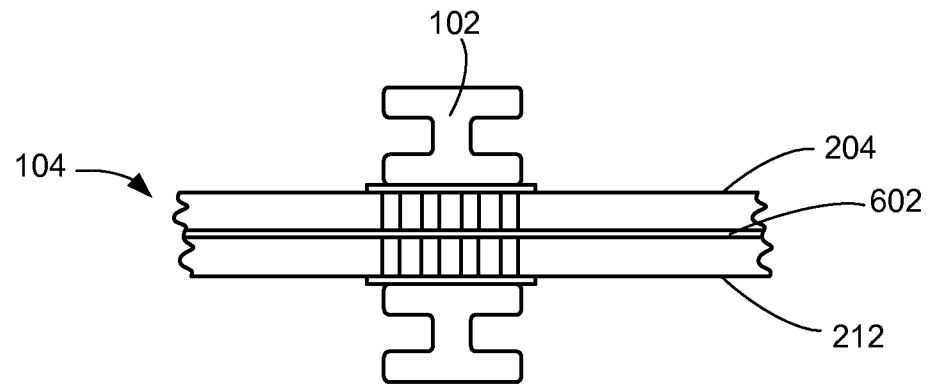
FIG. 7 is a cross-sectional view of the surface mount heat sinks mounted on the substrate bottom side and the substrate top side.

Referring now to FIG. 7, therein is shown a cross-sectional view of the surface mount heat sinks 102 mounted on the substrate bottom side 212 and the substrate top side 204. When used on both sides, including the substrate bottom side 212 and the substrate top side 204, the surface mount heat sinks 102 capture the substrate 104 as to reduce effects of external vibration by reducing areas of the substrate 104, over which the substrate 104 can flex during the vibration. The substrate 104 can include the internal reference layer 602.

FIG. 7 illustrates how two of the surface mount heat sinks 102 can be mounted directly opposite to and directly over each other for forming an internal standoff between the substrate 104 and another of the substrate 104, while allowing heat to transfer away from the substrate 104 to the another of the substrate 104. The substrate 104 can represent an internal substrate that is in between the surface mount heat sinks 102.

It has been discovered that the surface mount heat sinks 102 on the substrate bottom side 212 and the substrate top side 204 provide improved reliability because the surface mount heat sinks 102 reduce the areas of the substrate 104, over which the substrate 104 flex during the vibration, resulting in improved structural integrity of the substrate 104.

Figure 8:
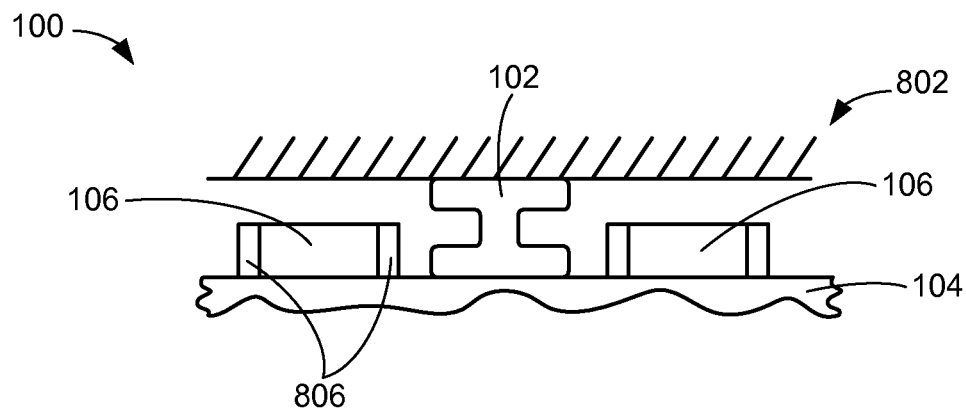
FIG. 8 is a cross-sectional view of one of the surface mount heat sinks attached to an external layer of the electronic system.

Referring now to FIG. 8, therein is shown a cross-sectional view of one of the surface mount heat sinks 102 attached to an external layer 802 of the electronic system 100. The surface mount heat sinks 102 provide protection from the external layer 802 from being in direct contact with the electrical devices 106. For illustrative purposes, FIG. 8 depicts one of the surface mount heat sinks 102 attached directly to the external layer 802, although it is understood that any number of the surface mount heat sinks 102 can be attached directly to the external layer 802.

The external layer 802 is defined as a conductive structure used to thermally conduct heat away from active components. The external layer 802 is in a plane external to and away from the substrate 104. The external layer 802 is physically isolated from the electrical devices 106. Contacts 806 of the electrical devices 106 are not in direct contact with and electrically connected to the external layer 802 since the surface mount heat sinks 102 provide spacing between the contacts 806 and the external layer 802. The contacts 806 are defined as conductive structures that provide electrical connectivity between the electrical devices 106 and other electrical components.

FIG. 8 illustrates how the surface mount heat sinks 102 are used for multiple purposes. One of the purposes is to primarily provide area specific heat sinks, which transfer heat to the external layer 802 or multiple additional layers of the electronic system 100. Another of the purposes is to provide a method to keep a next layer or the external layer 802 of the electronic system 100 from contacting surrounding devices or the electrical devices 106 next to the surface mount heat sinks 102.

For example, the external layer 802 can be the case previously described above or an external case assembly. In this example, another of the purposes is to transfer heat from the substrate 104 to the external layer 802. Also for example, the external layer 802 can be a next layer of the electronic system 100 including a SSD drive.

As an example, FIG. 8 also illustrates a possibility of using the surface mount heat sinks 102 for electrically connecting the substrate 104 to the external layer 802 including an outer case of an assembly of the electronic system 100. This can be used to provide a pathway for electro static discharge (ESD) to a ground system of the assembly, while providing a mechanism to preventing another layer or the external layer 802 including the case from coming into contact with the electrical devices 106 mounted on the substrate 104. In some products, an ESD connection has to be made with a wire (or other mechanisms) connecting the substrate 104 to the outer case of the assembly.

It has been discovered that the surface mount heat sinks 102 providing a standoff directly between the substrate 104 and the external layer 802 provides improved reliability since the surface mount heat sinks 102 physically isolate the electrical devices 106 mounted on the substrate 104 from the external layer 802. The physical isolation prevents the contacts 806 of the electrical devices 106 from contacting the external layer 802 thereby eliminating electrical shorts between the electrical devices 106 and the external layer 802.

Figure 9:
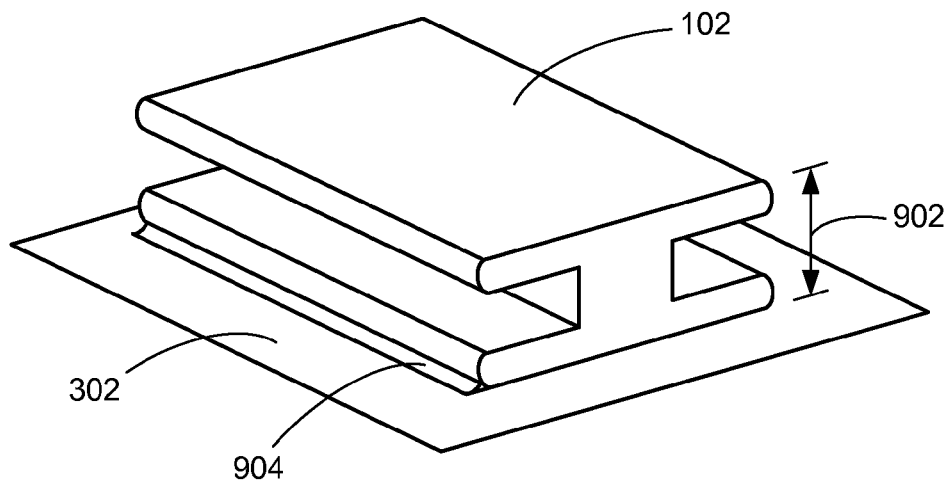
FIG. 9 is a top isometric view of one of the surface mount heat sinks.

Referring now to FIG. 9, therein is shown a top isometric view of one of the surface mount heat sinks 102. The surface mount heat sinks 102 can have a heat sink height 902 for providing physical isolation between the electrical devices 106 of FIG. 1 and the external layer 802 of FIG. 8. The heat sink height 902 can be used for mechanical component protection for the contacts 806 of FIG. 8 of the electrical devices 106 from contacting the external layer 802. The heat sink height 902 is greater than heights of the electrical devices 106.

The surface mount heat sinks 102 can be attached to the thermal pad 302 of the substrate 104 of FIG. 1. For illustrative purposes, the thermal pad 302 is shown having a predetermined dimension for mounting only one of the surface mount heat sinks 102, although it is understood that the thermal pad 302 can have any dimensions. For example, the thermal pad 302 can have any predetermined dimension for mounting one of the surface mount heat sinks 102 and the device heat sink tab 206 of FIG. 2 of one of the electrical devices 106.

The surface mount heat sinks 102 can be attached to the thermal pad 302 with a conductive layer 904. The conductive layer 904 includes an electrically conductive material including solder for electrically and thermally connecting components.

Figure 10:
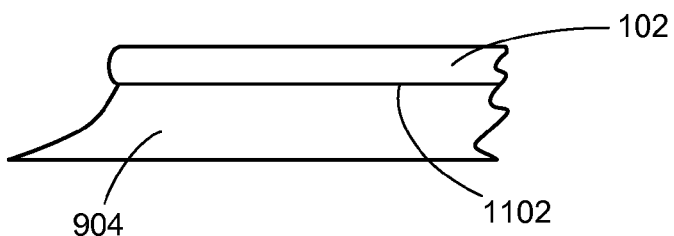
FIG. 10 is a cross-sectional view of the conductive layer.

Referring now to FIG. 10, therein is shown a cross-sectional view of the conductive layer 904. A bottom side of the conductive layer 904 is directly on the thermal pad 302 of FIG. 3. A top side of the conductive layer 904 is directly on heat sink bases or heat sink bottom sides 1002 of the surface mount heat sinks 102.

Figure 11:
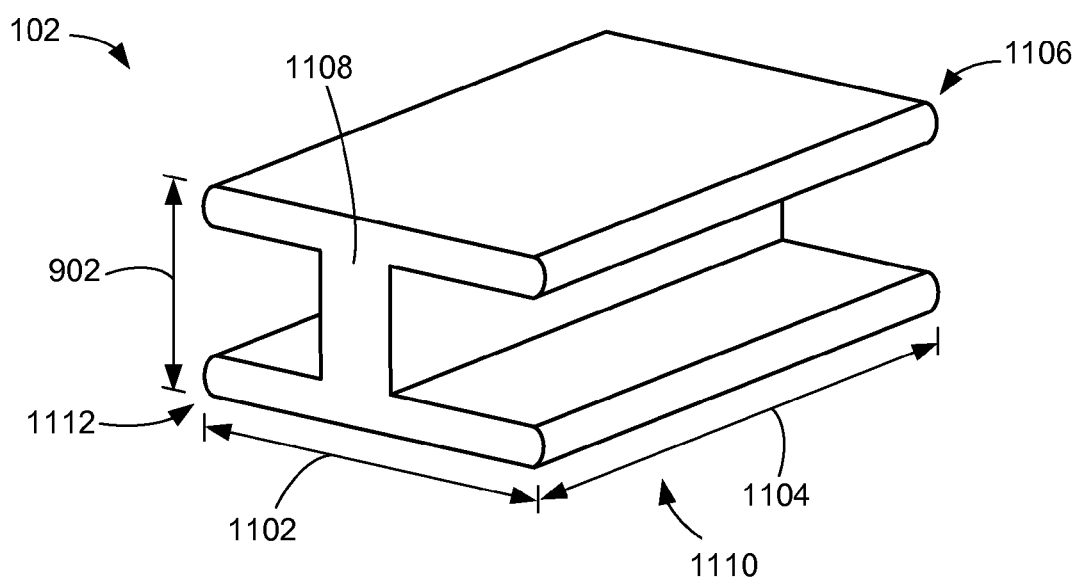
FIG. 11 is a top isometric view with guidelines for construction of the surface mount heat sinks.

Referring now to FIG. 11, therein is shown a top isometric view with guidelines for construction of the surface mount heat sinks 102. Each of the surface mount heat sinks 102 includes the heat sink height 902, a heat sink width 1102, and a heat sink length 1104. The heat sink height 902 is determined based on heights of the electrical devices 106 of FIG. 1. The heat sink height 902 is greater than a height of the highest device among the electrical devices 106 that are mounted over the substrate 104 of FIG. 1.

The construction of the surface mount heat sinks 102 can conform to predefined surface mount devices. The heat sink width 1102 and the heat sink length 1104 are based on a predetermined footprint for SMD devices. The thermal pad 302 of FIG. 3 can be configured based on the predetermined footprint associated with the heat sink width 1102 and the heat sink length 1104.

For example, the surface mount heat sinks 102 can conform to predefined footprints. As a specific example, the predefined footprints can include a 1208 or 2516 SMT resistor footprint. This would allow board layout to use the predefined footprints and for pick-and-place machines to automatically place the surface mount heat sinks 102 on a target board or the substrate 104. The main idea is to eliminate or greatly reduce a number of manual operations that are needed in a PCB assembly.

The surface mount heat sinks 102 include extruded shapes 1106 characteristic of being formed using the extrusion mechanism. The extrusion mechanism is a process used to create objects having a fixed, cross-sectional profile. The extrusion mechanism includes a process of forming a continuous structure having the fixed, cross-sectional profile and singulating the continuous structure to form individual units.

The extruded shapes 1106 include a uniform cross-section 1108 and a fixed length 1110. The uniform cross-section 1108 refers to the surface mount heat sinks 102 having substantially the same area at any section created using singulation along the heat sink length 1104. The fixed length 1110 refers to the surface mount heat sinks 102 having substantially the same value of the heat sink length 1104.

The surface mount heat sinks 102 can include two planar ends 1112 opposite each other. The planar ends 1112 are provided by the singulation. The singulation is a process of producing individual units from a continuous, extruded structure. For example, the singulation process can include cutting, sawing, laser, or any other separation methods. Also for example, the singulation process can be used to cut the continuous, extruded structure to size forming the surface mount heat sinks 102 as individual units.

The surface mount heat sinks 102 can be made using one very long single extruded device or structure and then, in a post process, singulate including cut the device or structure to individual units. The individual units can have correct, predetermined features including the heat sink length 1104, the extruded shapes 1106, the uniform cross-section 1108, the fixed length 1110, and the planar ends 1112.

The surface mount heat sinks 102 can also be made by singulating including cutting the device or structure into a number of individual units having different lengths, therefore making it less expensive to make. For example, each of the surface mount heat sinks 102 can have a different value for the heat sink length 1104.

The surface mount heat sinks 102 can have a number of the extruded shapes 1106. The extruded shapes 1106 can be selected or determined based on available board space on the substrate 104. The extruded shapes 1106 can be selected based on predetermined airflow in the electronic system 100 of FIG. 1 at the surface of the substrate 104 or between the substrate and the external layer 802 of FIG. 8.

The extruded shapes 1106 can be selected based on ability to protect the surrounding devices or the electrical devices 106 next to the surface mount heat sinks 102 from coming in contact with the external layer 802 including the case or other layers of the assembly. Embodiments subsequently described in FIGS. 15-21 provide different configurations of the extruded shapes 1106. The different configurations allow the surface mount heat sinks 102 to be available as surface mount devices using tape-and-reel packaging.

It has been discovered that the surface mount heat sinks 102 having the heat sink width 1102 and the heat sink length 1104 based on the predefined footprints eliminate manual operations in a PCB assembly thereby improving productivity and reducing manufacture cost.

It has also been discovered that the surface mount heat sinks 102 having the extruded shapes 1106 with the uniform cross-section 1108 and the fixed length 1110 provide improved structural integrity. The improved structural integrity is provided by using the extrusion mechanism with better controllability resulting in the surface mount heat sinks 102 having consistently shaped cross-sections, which are not provided by existing heat sinks that require extra machining processes and increased costs. The extruded shapes 1106 also allows manufacture of the surface mount heat sinks 102 cheaper.

Figure 12:
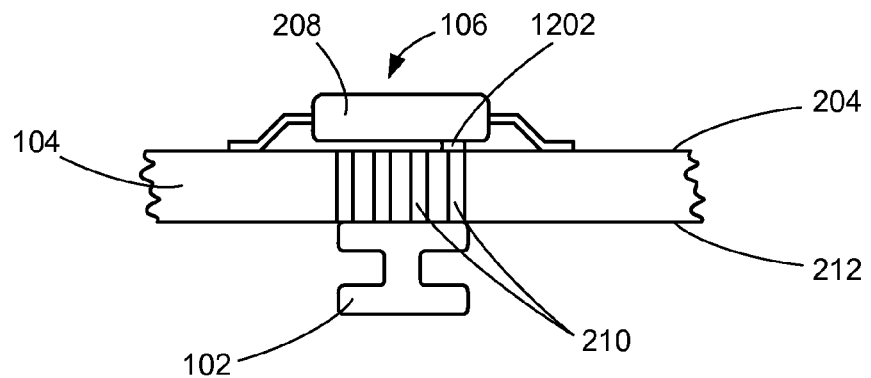
FIG. 12 is a cross-sectional view of one of the surface mount heat sinks attached under one of the electrical devices.

Referring now to FIG. 12, therein is shown a cross-sectional view of one of the surface mount heat sinks 102 attached under one of the electrical devices 106. FIG. 12 shows the one of the electrical devices 106 on the substrate top side 204 and the one of the surface mount heat sinks 102 on the other side or the substrate bottom side 212 of the substrate 104 and under the one of the electrical devices 106. Cooling or heat extraction occurs by conducting heat from the one of the electrical devices 106 through the vias 210 in the substrate 104 to the surface mount heat sinks 102 directly under the one of the electrical devices 106.

Thermal connections can be made using a conductive slug 1202 including solder slug formed between and directly on a bottom side of the package body 208 of the one of the electrical devices 106 and contact pads at the substrate top side 204. The conductive slug 1202 is defined as a structure used to thermally conduct heat away from an electrical component.

The contact pads are directly on the vias 210. The vias 210 are directly on the surface mount heat sinks 102. The heat directly from the electrical devices 106 is removed by the surface mount heat sinks 102. This helps keep the heat generated from the electrical devices 106 from being dumped completely into the substrate 104.

It has been discovered that the surface mount heat sinks 102 directly under the electrical devices 106 provide improved reliability because the heat directly generated from the electrical devices 106 is conducted, through the conductive slug 1202 and the vias 210, to the surface mount heat sinks 102.

Figure 13:
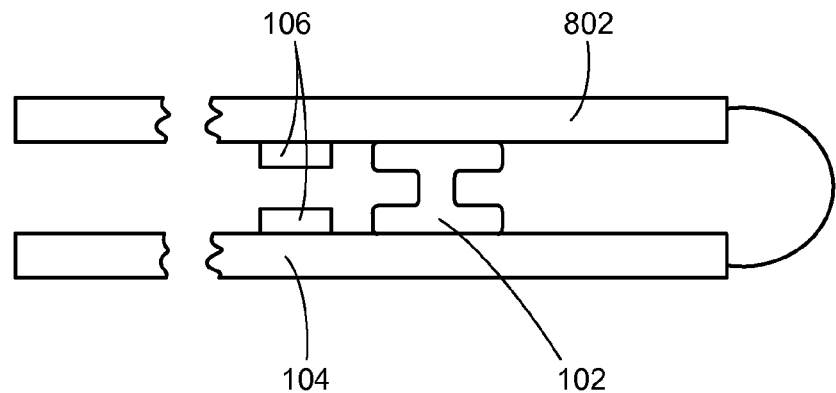
FIG. 13 is a cross-sectional view of one of the surface mount heat sinks attached to the external layer.

Referring now to FIG. 13, therein is shown a cross-sectional view of one of the surface mount heat sinks 102 attached to the external layer 802. The surface mount heat sinks 102 provide protection from the external layer 802 from being in direct contact with the electrical devices 106. For illustrative purposes, FIG. 13 depicts one of the surface mount heat sinks 102 attached directly to the external layer 802, although it is understood that any number of the surface mount heat sinks 102 can be attached directly to the external layer 802.

For example, FIG. 13 depicts a multi-PCB configuration with the substrate 104 and the external layer 802, whereby the external layer 802 is another substrate or a board. The another substrate or the board is a support structure that provides electrical connectivity and thermal conduction between electrical devices mounted thereon. For example, the external layer 802 can be a support structure including a printed circuit board (PCB).

Thermal conduction is provided by the surface mount heat sinks 102 attached to and between the substrate 104 and the external layer 802. This allows heat transfer from one board to another board and if there is airflow between the two boards provide a mechanism for extracting the heat out from between the boards.

It has been discovered that the surface mount heat sinks 102 providing a standoff directly between the substrate 104 and the external layer 802 provides improved reliability. The improved reliability is provided because the surface mount heat sinks 102 physically isolate the electrical devices 106 mounted on the substrate 104 from the external layer 802 and the electrical devices 106 mounted on the external layer 802 from the substrate 104. The physical isolation prevents the contacts 806 of FIG. 8 of the electrical devices 106 from contacting the external layer 802 or the substrate 104 thereby eliminating electrical shorts between the electrical devices 106 and the external layer 802 or the substrate 104.

It has also been discovered that the surface mount heat sinks 102 attached to and between the substrate 104 and the external layer 802 provides improved reliability. The improved reliability is provided because they allow heat transfer from one board to another board and if there is airflow between the two boards provide a mechanism for extracting the heat out from between the boards.

Figure 14:
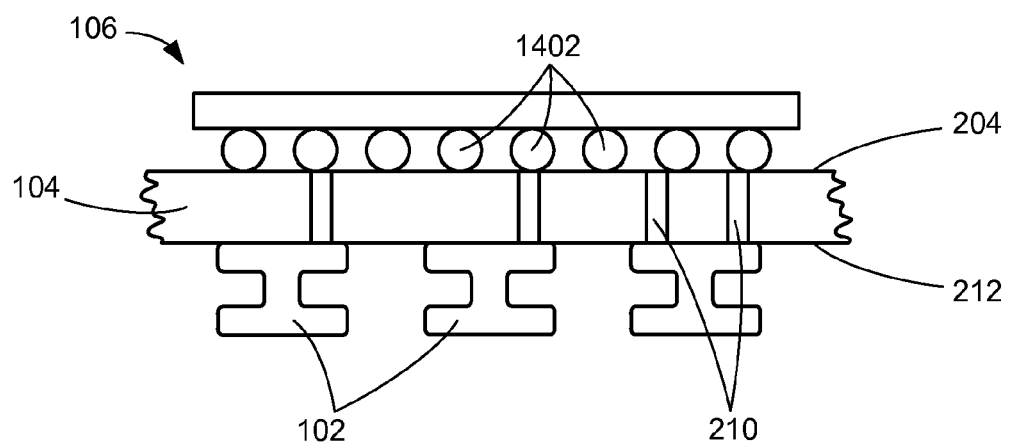
FIG. 14 is a cross-sectional view of multiple of the surface mount heat sinks attached under one of the electrical devices.

Referring now to FIG. 14, therein is shown a cross-sectional view of multiple of the surface mount heat sinks 102 attached under one of the electrical devices 106. FIG. 14 shows the one of the electrical devices 106 on the substrate top side 204 and the multiple of the surface mount heat sinks 102 on the other side or the substrate bottom side 212 of the substrate 104 and under the one of the electrical devices 106.

Cooling or heat extraction occurs by conducting heat from the one of the electrical devices 106 through the vias 210 in the substrate 104 to the surface mount heat sinks 102 directly under the one of the electrical devices 106. For example, the electrical devices 106 can be semiconductor devices including ball grid array (BGA) type device packages.

For example, FIG. 14 depicts a drawing of a ball grid array, which does not have a heat sink slug. Selected or predetermined ball connections, which can be used for ground connections, can be used to extract heat from the device connectors 1402 including balls with via connections or the vias 210 shown in the drawing.

Thermal connections can be made using device connectors 1402 of the one of the electrical devices 106 and the contact pads at the substrate top side 204. The contact pads are directly on the vias 210. The vias 210 are directly on the surface mount heat sinks 102. The heat directly from the one of the electrical devices 106 is removed by the surface mount heat sinks 102. This helps keep the heat from the one of the electrical devices 106 from being dumped completely into the substrate 104.

It has been discovered that the multiple of the surface mount heat sinks 102 directly under the one of the electrical devices 106 provide improved reliability because the heat directly from the one of the electrical devices 106 is conducted, through the device connectors 1402 and the vias 210, to the multiple of the surface mount heat sinks 102.

Figure 15:
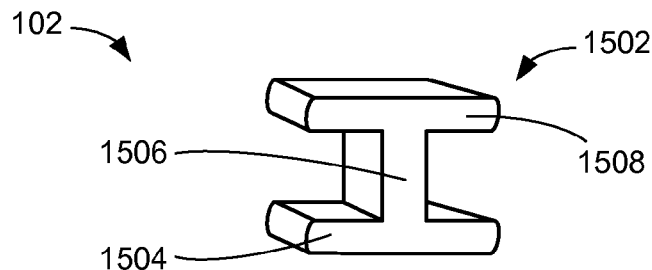
FIG. 15 is a top isometric view of a first exemplary configuration of the surface mount heat sinks.

Referring now to FIG. 15, therein is shown a top isometric view of a first exemplary configuration of the surface mount heat sinks 102. FIG. 15 depicts another of the extruded shapes 1106 of FIG. 11 of the surface mount heat sinks 102.

The extruded shapes 1106 can include an I-beam shape 1502. The I-beam shape 1502 includes a base portion 1504, a non-horizontal portion 1506, and a top portion 1508. The base portion 1504 and the top portion 1508 can be attached to the substrate 104 of FIG. 1 and the external layer 802 of FIG. 8, respectively.

The base portion 1504 can be substantially perpendicular to the non-horizontal portion 1506. The non-horizontal portion 1506 can be substantially perpendicular to the top portion 1508. The base portion 1504 can include a length substantially equal to a length of the top portion 1508. The base portion 1504 can be substantially parallel to the top portion 1508.

It is more reliable to attach the surface mount heat sinks 102 having the I-beam shape 1502 to the substrate 104 and the external layer 802 compared to a solid block that does not have the base portion 1504, the non-horizontal portion 1506, and the top portion 1508. For example, it is very difficult to attach the solid block using solder. As a specific example, the solid block or an object that has a very large thermal mass requires a hotter or extremely high temperature in an oven and much longer time for reflowing. As a result, the hotter or extremely high temperature would damage the electrical devices 106 of FIG. 1.

The surface mount heat sinks 102 having the I-beam shape 1502 with reduced thermal mass can be attached at a lower temperature during reflow. As such, the surface mount heat sinks 102 having the I-beam shape 1502 is much better than the solid block for reflowing processes.

It has been discovered that the surface mount heat sinks 102 having the I-beam shape 1502 with the base portion 1504, the non-horizontal portion 1506, and the top portion 1508 provides improved reliability. The reliability is improved because it is more reliable to attach the surface mount heat sinks 102 having the reduced thermal mass with the I-beam shape 1502 compared to heat sinks having the solid block.

Figure 16:
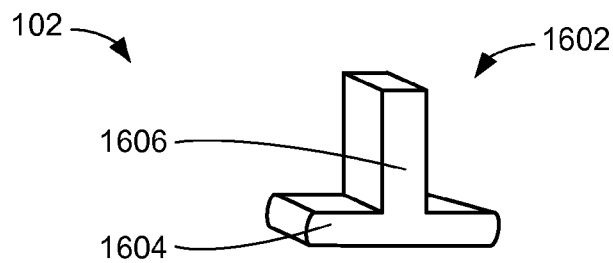
FIG. 16 is a top isometric view of a second exemplary configuration of the surface mount heat sinks.

Referring now to FIG. 16, therein is shown a top isometric view of a second exemplary configuration of the surface mount heat sinks 102. FIG. 16 depicts one of the extruded shapes 1106 of FIG. 11 of the surface mount heat sinks 102.

The extruded shapes 1106 can include a T-beam shape 1602. One of the surface mount heat sinks 102 is shown in an inverted T-beam configuration. The T-beam shape 1602 includes a base portion 1604 and a non-horizontal portion 1606. The base portion 1604 and the non-horizontal portion 1606 can be attached to the substrate 104 of FIG. 1 and the external layer 802 of FIG. 8, respectively. The base portion 1604 can be substantially perpendicular to the non-horizontal portion 1606.

The T-beam shape 1602 provides structural and thermal support between the substrate 104 and the external layer 802 with a minimal thermal flow from the substrate 104 to the external layer 802. For example, the surface mount heat sinks 102 can provide the support between a board to another board or a board to a case.

It has been discovered that the surface mount heat sinks 102 having the T-beam shape 1602 with the base portion 1604 substantially perpendicular to the non-horizontal portion 1606 provides improved structural support between the substrate 104 and the external layer 802 thereby improving overall structural integrity of the electronic system 100 of FIG. 1.

Figure 17:
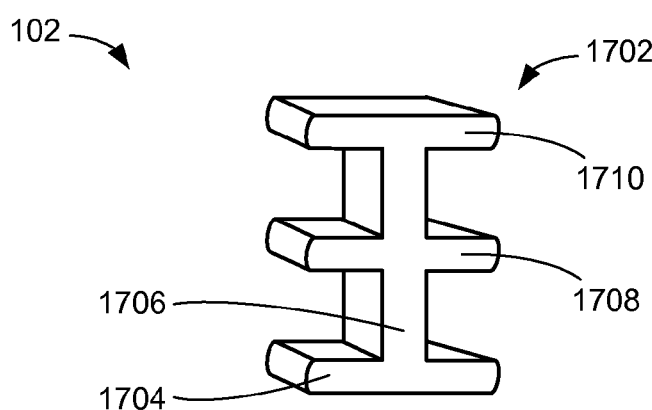
FIG. 17 is a top isometric view of a third exemplary configuration of the surface mount heat sinks.

Referring now to FIG. 17, therein is shown a top isometric view of a third exemplary configuration of the surface mount heat sinks 102. FIG. 17 depicts another of the extruded shapes 1106 of FIG. 11 of the surface mount heat sinks 102.

The extruded shapes 1106 can include a tree shape 1702. The tree shape 1702 includes a base portion 1704, a non-horizontal portion 1706, middle portions 1708, and a top portion 1710. The base portion 1704 and the top portion 1710 can be attached to the substrate 104 of FIG. 1 and the external layer 802 of FIG. 8, respectively. The base portion 1704 can be substantially perpendicular to the non-horizontal portion 1706. The non-horizontal portion 1706 can be substantially perpendicular to the top portion 1710.

The base portion 1704 can include a length substantially equal to a length of the top portion 1710. The base portion 1704, the middle portions 1708, and the top portion 1710 can be substantially parallel to each other. The middle portions 1708 can be substantially perpendicular to the non-horizontal portion 1706. The middle portions 1708 can include substantially the same length.

It has been discovered that the surface mount heat sinks 102 having the tree shape 1702 provides improved reliability because the tree shape 1702 has the middle portions 1708 in addition to the base portion 1704, the non-horizontal portion 1706, and the top portion 1710. The reliability is improved because the middle portions 1708 provide additional surface areas for extracting more heat away from the electrical devices 106 of FIG. 1. Air flowing between the middle portions 1708 and the base portion 1704 and the top portion 1710 provides improved heat conduction to surrounding environment or ambient in addition to conducting heat from the substrate 104 to the external layer 802.

Figure 18:
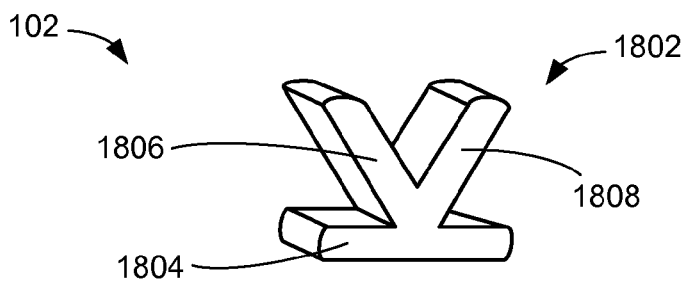
FIG. 18 is a top isometric view of a fourth exemplary configuration of the surface mount heat sinks.

Referring now to FIG. 18, therein is shown a top isometric view of a fourth exemplary configuration of the surface mount heat sinks 102. FIG. 18 depicts one of the extruded shapes 1106 of FIG. 11 of the surface mount heat sinks 102.

The extruded shapes 1106 can include a V-beam shape 1802. The V-beam shape 1802 includes a base portion 1804, a first non-horizontal portion 1806, and a second non-horizontal portion 1808. The base portion 1804 can be attached to the substrate 104 of FIG. 1. The first non-horizontal portion 1806 and the second non-horizontal portion 1808 can be attached to the external layer 802 of FIG. 8. The first non-horizontal portion 1806 and the second non-horizontal portion 1808 can include substantially the same length.

The first non-horizontal portion 1806 and the second non-horizontal portion 1808 can be directly on the base portion forming a V shape. The first non-horizontal portion 1806 can be formed at an angle less than 90 degrees from a portion of the base portion 1804 that is closest to the first non-horizontal portion 1806. The second non-horizontal portion 1808 can be formed at an angle less than 90 degrees from a portion of the base portion 1804 that is closest to the second non-horizontal portion 1808.

The V-beam shape 1802 provides structural and thermal support between the substrate 104 and the external layer 802 with a minimal thermal flow from the substrate 104 to the external layer 802. For example, the surface mount heat sinks 102 can provide the support between a board to another board or a board to a case.

It has been discovered that the surface mount heat sinks 102 having the V-beam shape 1802 with the base portion 1804, the first non-horizontal portion 1806, and the second non-horizontal portion 1808 provides improved structural support between the substrate 104 and the external layer 802 thereby improving overall structural integrity of the electronic system 100 of FIG. 1.

It has also been discovered that the first non-horizontal portion 1806 and the second non-horizontal portion 1808 formed in a V-shape configuration also provides improved thermal extraction since they provide additional surface areas in contact with the external layer 802 for extracting additional heat away from the electrical devices 106 of FIG. 1.

Figure 19:
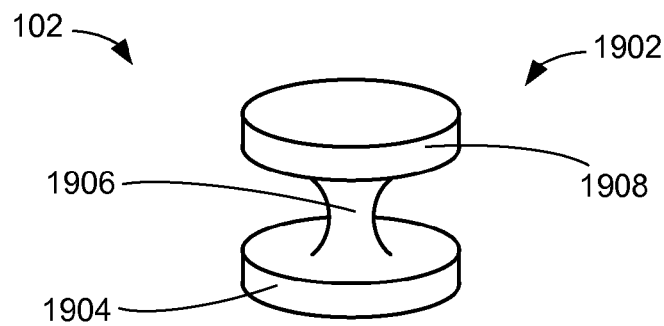
FIG. 19 is a top isometric view of a fifth exemplary configuration of the surface mount heat sinks.

Referring now to FIG. 19, therein is shown a top isometric view of a fifth exemplary configuration of the surface mount heat sinks 102. FIG. 19 depicts one of the extruded shapes 1106 of FIG. 11 of the surface mount heat sinks 102.

The extruded shapes 1106 can include a button shape 1902. The button shape 1902 includes a base portion 1904, a non-horizontal portion 1906, and a top portion 1908. The base portion 1904 and the top portion 1908 can be attached to the substrate 104 of FIG. 1 and the external layer 802 of FIG. 8, respectively. The base portion 1904 can be substantially perpendicular to the non-horizontal portion 1906. The non-horizontal portion 1906 can be substantially perpendicular to the top portion 1908.

The base portion 1904 can include a length substantially equal to a length of the top portion 1908. The base portion 1904 can be substantially parallel to the top portion 1908. The base portion 1904 and the top portion 1908 can be cylindrical.

It is more reliable to attach the surface mount heat sinks 102 having the button shape 1902 to the substrate 104 and the external layer 802 compared to the solid block that does not have the base portion 1904, the non-horizontal portion 1906, and the top portion 1908. For example, it is very difficult to attach the solid block using solder. As a specific example, the solid block or an object that has a very large thermal mass requires a hotter or extremely high temperature in an oven and much longer time for reflowing. As a result, the hotter or extremely high temperature would damage the electrical devices 106 of FIG. 1.

The surface mount heat sinks 102 having the button shape 1902 with reduced thermal mass can be attached at a lower temperature during reflow. As such, the surface mount heat sinks 102 having the button shape 1902 is much better than the solid block for reflowing processes.

The surface mount heat sinks 102 include the extruded shapes 1106 characteristic of being formed using the extrusion mechanism. The extruded shapes 1106 can be formed by forming a continuous cylindrical structure having the fixed, cross-sectional profile. The continuous cylindrical structure can be singulated to form individual cylindrical units.

The individual cylindrical units can then be further processed to form the surface mount heat sinks 102 having the button shape 1902. The individual cylindrical units can then be further processed using an additional method including milling, grinding, machining, coining, stamping, hammering, pulling, any other mechanical methods, or a combination thereof.

It has been discovered that the surface mount heat sinks 102 having the button shape 1902 with the base portion 1904, the non-horizontal portion 1906, and the top portion 1908 provides improved reliability. The reliability is improved because it is more reliable to attach the surface mount heat sinks 102 having the reduced thermal mass with the button shape 1902 compared to heat sinks having the solid block.

Figure 20:
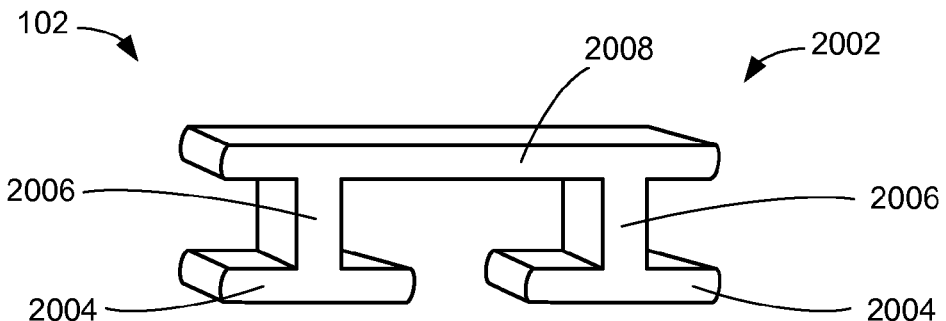
FIG. 20 is a top isometric view of a sixth exemplary configuration of the surface mount heat sinks.

Referring now to FIG. 20, therein is shown a top isometric view of a sixth exemplary configuration of the surface mount heat sinks 102. FIG. 20 depicts another of the extruded shapes 1106 of FIG. 11 of the surface mount heat sinks 102.

The extruded shapes 1106 can include a 2-foot shape 2002. The 2-foot shape 2002 includes base portions 2004, non-horizontal portions 2006, and a top portion 2008. The base portions 2004 and the top portion 2008 can be attached to the substrate 104 of FIG. 1 and the external layer 802 of FIG. 8, respectively. The base portions 2004 can be substantially perpendicular to the non-horizontal portions 2006. The non-horizontal portions 2006 can be substantially perpendicular to the top portion 2008. The non-horizontal portions 2006 can be substantially parallel to each other.

The base portions 2004 can include substantially the same length. The base portions 2004 can be substantially parallel to the top portion 2008. Bottom surfaces of the base portions 2004 can be substantially coplanar with each other. Top surfaces of the base portions 2004 can be substantially coplanar with each other. The non-horizontal portions 2006 directly on the base portions 2004 are formed next to or at ends of the top portion 2008 forming the surface mount heat sinks 102 having the 2-foot shape 2002.

It is more reliable to attach the surface mount heat sinks 102 having the 2-foot shape 2002 to the substrate 104 and the external layer 802 compared to the solid block that does not have the base portions 2004, the non-horizontal portions 2006, and the top portion 2008. For example, it is very difficult to attach the solid block using solder. As a specific example, the solid block or an object that has a very large thermal mass requires a hotter or extremely high temperature in an oven and much longer time for reflowing. As a result, the hotter or extremely high temperature would damage the electrical devices 106 of FIG. 1.

The surface mount heat sinks 102 having the 2-foot shape 2002 with reduced thermal mass can be attached at a lower temperature during reflow. As such, the surface mount heat sinks 102 having the 2-foot shape 2002 is much better than the solid block for reflowing processes. The surface mount heat sinks 102 having the 2-foot shape 2002 allow heat extraction from two locations on the substrate 104 to one location on the external layer 802.

It has been discovered that the surface mount heat sinks 102 having the 2-foot shape 2002 with the base portions 2004, the non-horizontal portions 2006, and the top portion 2008 provides improved reliability. The reliability is improved because it is more reliable to attach the surface mount heat sinks 102 having the reduced thermal mass with the 2-foot shape 2002 compared to heat sinks having the solid block.

It has also been discovered that the surface mount heat sinks 102 having the 2-foot shape 2002 provides improved reliability because the 2-foot shape 2002 allows more heat extraction from multiple locations on the substrate 104 through the base portions 2004 and the non-horizontal portions 2006.

Figure 21:
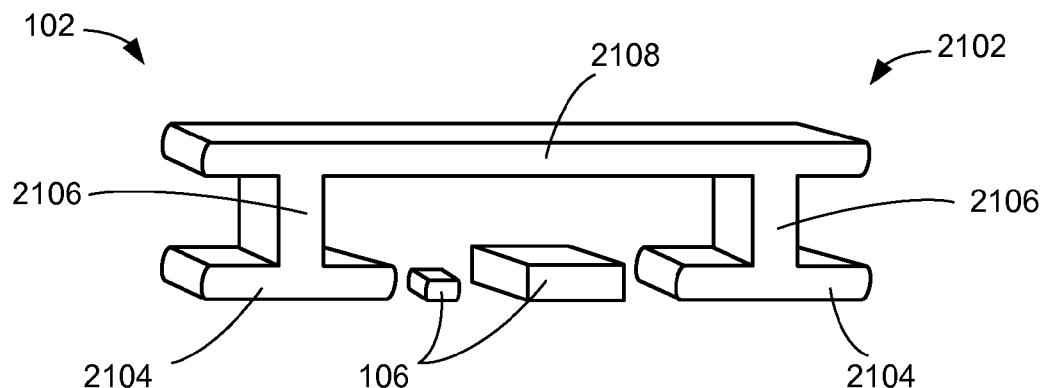
FIG. 21 is a top isometric view of a seventh exemplary configuration of the surface mount heat sinks.

Referring now to FIG. 21, therein is shown a top isometric view of a seventh exemplary configuration of the surface mount heat sinks 102. FIG. 21 depicts another of the extruded shapes 1106 of FIG. 11 of the surface mount heat sinks 102.

The extruded shapes 1106 can include a double-beam shape 2102. The double-beam shape 2102 includes base portions 2104, non-horizontal portions 2106, and a top portion 2108. The base portions 2104 and the top portion 2108 can be attached to the substrate 104 of FIG. 1 and the external layer 802 of FIG. 8, respectively. The base portions 2104 can be substantially perpendicular to the non-horizontal portions 2106. The non-horizontal portions 2106 can be substantially perpendicular to the top portion 2108. The non-horizontal portions 2106 can be substantially parallel to each other.

The base portions 2104 can include substantially the same length. The base portions 2104 can be substantially parallel to the top portion 2108. Bottom surfaces of the base portions 2104 can be substantially coplanar with each other. Top surfaces of the base portions 2104 can be substantially coplanar with each other. The non-horizontal portions 2106 directly on the base portions 2104 are formed next to or at two ends of the top portion 2108 forming the surface mount heat sinks 102 having the double-beam shape 2102.

It is more reliable to attach the surface mount heat sinks 102 having the double-beam shape 2102 to the substrate 104 and the external layer 802 compared to the solid block that does not have the base portions 2104, the non-horizontal portions 2106, and the top portion 2108. For example, it is very difficult to attach the solid block using solder. As a specific example, the solid block or an object that has a very large thermal mass requires a hotter or extremely high temperature in an oven and much longer time for reflowing. As a result, the hotter or extremely high temperature would damage the electrical devices 106.

The surface mount heat sinks 102 having the double-beam shape 2102 with reduced thermal mass can be attached at a lower temperature during reflow. As such, the surface mount heat sinks 102 having the double-beam shape 2102 is much better than the solid block for reflowing processes. The surface mount heat sinks 102 having the double-beam shape 2102 allow heat extraction from two locations on the substrate 104 to one location on the external layer 802.

The surface mount heat sinks 102 having the double-beam shape 2102 can be mounted in a straddle configuration over a number of active components or the electrical devices 106 such that the electrical devices 106 can be mounted between the non-horizontal portions 2106 that are directly on the base portions 2104. The electrical devices 106 can be mounted under the top portion 2108 with spacing between the electrical devices 106 and the top portion 2108. The double-beam shape 2102 allows more heat extraction from the electrical devices 106 through the non-horizontal portions 2106 directly on the base portions 2104.

It has been discovered that the surface mount heat sinks 102 having the double-beam shape 2102 with the base portions 2104, the non-horizontal portions 2106, and the top portion 2108 provides improved reliability. The reliability is improved because it is more reliable to attach the surface mount heat sinks 102 having the reduced thermal mass with the double-beam shape 2102 compared to heat sinks having the solid block.

It has also been discovered that the surface mount heat sinks 102 having the double-beam shape 2102 provides improved reliability because the double-beam shape 2102 allows more heat extraction from multiple locations on the substrate 104 through the base portions 2104 and the non-horizontal portions 2106.

It has further been discovered that the double-beam shape 2102 provides improved reliability because it allows the surface mount heat sinks 102 to be mounted in the straddle configuration over a number of the electrical devices 106. As a result, more heat is extracted from the electrical devices 106 through the non-horizontal portions 2106 directly on the base portions 2104 that are next to the electrical devices 106.

Figure 22:
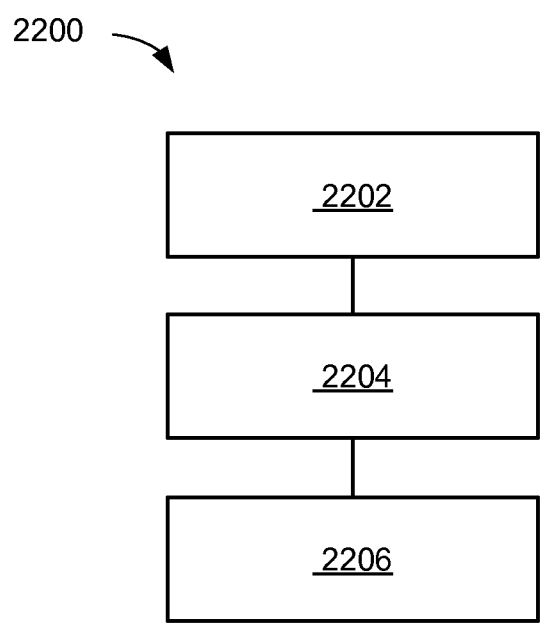
FIG. 22 is a flow chart of a method of manufacture of an electronic system in a further embodiment of the present invention.

Referring now to FIG. 22, therein is shown a flow chart of a method 2200 of manufacture of an electronic system in a further embodiment of the present invention. The method 2200 includes: providing a substrate in a block 2202; mounting an electrical device over the substrate in a block 2204; and mounting a surface mount heat sink next to the electrical device, the surface mount heat sink having an extruded shape characteristic of being formed using an extrusion mechanism in a block 2206.

Accordingly, it has been discovered that the embodiments described herein thus have numerous aspects. One such aspect is that the embodiments provide a means to transfer heat from a PCB to another assembly component or to the external case of the unit installed in, or to another layer of the internal assembly.

Another aspect of the embodiments is that they allow heat sinks to be soldered on to a PCB in the same fashion as normal SMT devices, without requiring new footprint designs.

Another aspect of the embodiments is that they provide a structural support to prevent the case from coming in contact with components inside the unit.

Another aspect of the embodiments is that they can conduct heat out of inner layers of the PCB assembly.

Another aspect of the embodiments is that they provide a means to reduce the effects of external vibration on the internal assemblies of the system (drive).

Another aspect of the embodiments is that they provide a means for using open board space as heat sink area.

It has also been discovered that the embodiments bring values to products. One such value is that they allow pick-and-place techniques to place the heat sinks instead of by hand.

Another value is that they allow for placement of heat sinks to extract heat from very exacting locations.

Another value is that they allow predefined SMT foot prints to be used in PCB designs.

Another value is that they simplify construction of PCB assemblies.

Another value is that they reduce cost of PCB assemblies.

Another value is that they remove some of manual or extra steps to the assembly process.

Another value is that they reduce the amount of extra materials inside the system to reduce vibration.

Current and future products benefit from the embodiments described herein. Concepts in the embodiments can be utilized for new board designs. The embodiments can be considered for current or new products that are space limited for conventional heat sink methods. The embodiments can be utilized for storage devices produced with multiple boards that are isolated with additional spacers. The embodiments can be utilized for complex cases designed that have to be made with multiple height areas in order to extract heat from inside the drive while avoiding coming in contact with the external case.

Thus, it has been discovered that the electronic system of the present invention furnishes important and heretofore unknown and unavailable solutions, capabilities, and functional aspects for an electronic system with heat extraction. The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An electronic system comprising:
a substrate;
an electrical device over the substrate; and
a surface mount heat sink next to the electrical device, the surface mount heat sink having an extruded shape formed using an extrusion mechanism, and the extruded shape including a base portion and a V-beam shape extending from the base portion, the V-beam shape including a first non-horizontal portion and a second non-horizontal portion, the base portion attached to the substrate, the first non-horizontal portion and the second non-horizontal portion extending outwardly from the base portion with the first non-horizontal portion and the second non-horizontal portion formed at an angle less than 90 degrees from the base portion.

2. The system as claimed in claim 1 wherein the surface mount heat sink is attached to an external layer and the substrate with the electrical device isolated from the external layer.

3. The system as claimed in claim 1 wherein:
the electrical device is directly over a thermal pad of the substrate; and
the surface mount heat sink is directly over the thermal pad.

4. The system as claimed in claim 1 wherein the surface mount heat sink is for providing a pathway for electro static discharge (ESD).

5. The system as claimed in claim 1 wherein the surface mount heat sink includes a uniform cross-section and a fixed length.

6. The system as claimed in claim 5 wherein the surface mount heat sink is attached to an external layer and the substrate with the electrical device isolated from the external layer, whereby the external layer is a case or a printed circuit board.

7. The system as claimed in claim 5 wherein:
the electrical device is directly over a thermal pad of the substrate; and
the surface mount heat sink is directly over and attached to the thermal pad.

* * * * *